United States Patent
Tian et al.

(10) Patent No.: US 11,940,507 B1
(45) Date of Patent: Mar. 26, 2024

(54) FIXATION AND REGISTRATION CALIBRATION SYSTEM FOR MULTIMODAL MAGNETIC PARTICLE IMAGING

(71) Applicant: Beijing University of Aeronautics and Astronautics, Beijing (CN)

(72) Inventors: Jie Tian, Beijing (CN); Bo Zhang, Beijing (CN); Jie He, Beijing (CN); Yu An, Beijing (CN)

(73) Assignee: Beijing University of Aeronautics and Astronautics, Beijing (CN)

( * ) Notice: Subject to any disclaimer, the term of this patent is extended or adjusted under 35 U.S.C. 154(b) by 0 days.

(21) Appl. No.: 18/384,837

(22) Filed: Oct. 28, 2023

(30) Foreign Application Priority Data

Feb. 13, 2023 (CN) .......................... 202310104165.2

(51) Int. Cl.
*G01R 33/12* (2006.01)
*G01R 33/00* (2006.01)

(52) U.S. Cl.
CPC ..... *G01R 33/1276* (2013.01); *G01R 33/0023* (2013.01); *G01R 33/0047* (2013.01)

(58) Field of Classification Search
CPC ....... A61B 5/0515; A61B 5/702; A61B 5/704; G01R 33/58; G01R 35/005; G01R 33/0052; G01R 33/0047

See application file for complete search history.

(56) References Cited

U.S. PATENT DOCUMENTS

| | | | |
|---|---|---|---|
| 2018/0017640 A1* | 1/2018 | Goodwill | G01N 27/72 |
| 2021/0059557 A1* | 3/2021 | Jong | G01R 33/0047 |
| 2021/0244309 A1* | 8/2021 | Top | A61B 5/7257 |

FOREIGN PATENT DOCUMENTS

| | | |
|---|---|---|
| CN | 1706347 A | 12/2005 |
| CN | 110625600 A | 12/2019 |
| CN | 209770510 U | 12/2019 |
| CN | 112329531 A | 2/2021 |
| CN | 115120350 A | 9/2022 |

* cited by examiner

*Primary Examiner* — Jermele M Hollington
*Assistant Examiner* — Taqi R Nasir
(74) *Attorney, Agent, or Firm* — Bayramoglu Law Offices LLC

(57) ABSTRACT

A fixation and registration calibration system for multimodal MPI is provided. The fixation and registration calibration system includes an upper limiting device connected to a lower limiting device by a hand screw and an adjustable position component, where the upper limiting device and the lower limiting device each are symmetrical about the adjustable position component; an auxiliary clamping device is fixed at an upper end of the upper limiting device; the upper limiting device, the lower limiting device, and the auxiliary clamping device are provided with magnetic particle calibration holes at different positions; and an MPI calibration sample is provided through the magnetic particle calibration holes to achieve spatial position registration calibration. The fixation and registration calibration system achieves fixation of the detected object for MPI, flexible spatial position calibration based on magnetic particles, and stable and reliable multimodal MPI.

15 Claims, 5 Drawing Sheets

FIXATION AND REGISTRATION CALIBRATION SYSTEM FOR MULTIMODAL MAGNETIC PARTICLE IMAGING

CROSS REFERENCE TO THE RELATED APPLICATIONS

This application is based upon and claims priority to Chinese Patent Application No. 202310104165.2, filed on Feb. 13, 2023, the entire contents of which are incorporated herein by reference.

TECHNICAL FIELD

The present disclosure belongs to the technical field of magnetic particle imaging (MPI), and particularly relates to a fixation and registration calibration system for multimodal MPI.

BACKGROUND

Magnetic particle imaging (MPI) is a new type of biomedical imaging method. Compared with existing medical imaging techniques, the greatest advantage of MPI lies in its higher sensitivity. In addition, MPI has higher temporal resolution, and does not cause ionizing radiation and tissue attenuation. Various researches have shown that MPI can be well applied in many biomedical fields, such as cell tracking, cancer imaging, thermal therapy and others. The working principle of MPI is roughly as follows: Superparamagnetic iron oxide nanoparticles (SPION) are detected, and excited through a set of different electromagnetic coils based on the topology of a scanner for spatial encoding, and finally image reconstruction is performed based on different algorithms.

MPI of objects, especially in-vivo imaging of animals, requires general anesthesia to ensure that the animals maintain a stable and stationary state during the detection process, so as to avoid errors in image results. According to the principle of MPI, MPI is in a functional imaging modality, where the imaging results only display the spatial concentration distribution of magnetic particles, rather than the structural information of the detected object. Therefore, MPI usually needs to be combined with computed tomography (CT) or magnetic resonance imaging (MRI) to provide the MPI image location in the structure. Due to this characteristic, the fixation of the detected object is particularly important when the imaging modality is converted. Moreover, in order to register the MPI results with other imaging modalities, it is necessary to add imaging registration points as needed so as to acquire stable and accurate MPI results.

However, the existing fixation and registration calibration devices for MPI cannot fix the detected object of MPI based on the MPI characteristic or flexibly select the magnetic particle calibration object, making it hard to fuse MPI with other structural imaging modalities. Therefore, it is highly desirable to develop a device in the art to fix the object during the MPI process and achieve imaging and registration calibration in multiple modalities.

SUMMARY

The present disclosure aims to solve the above-mentioned problem in the prior art, that is, the existing fixation and registration calibration devices for MPI cannot fix the detected object based on the MPI characteristic or flexibly select the magnetic particle calibration object, making it hard to fuse MPI with other structural imaging modalities. Therefore, the present disclosure provides a fixation and registration calibration system for multimodal MPI. The fixation and registration calibration system includes an upper limiting device 10, a lower limiting device 20, an auxiliary clamping device 30, and an MPI calibration sample 40, where the upper limiting device 10 is connected to the lower limiting device 20 by a hand screw and an adjustable position component; the upper limiting device 10 and the lower limiting device 20 each are symmetrical about the adjustable position component;

the auxiliary clamping device 30 is fixed at an upper end of the upper limiting device 10;

the upper limiting device 10, the lower limiting device 20, and the auxiliary clamping device 30 are provided with magnetic particle calibration holes at different positions; and the MPI calibration sample 40 is provided through the magnetic particle calibration holes to achieve spatial position registration calibration.

In some preferred embodiments, the adjustable position component includes a limiting slide rail 21;

the limiting slide rail 21 is configured to adjust and fix a displacement of each of the upper limiting device 10 and the lower limiting device 20 in upper and lower directions;

the limiting slide rail 21 is provided with an elongated hole 22; and the upper limiting device 10 and the lower limiting device 20 are fixed by a screw and the elongated hole 22; and the elongated hole 22 is configured to adjust a clamping height according to a size of a detected object, so as to achieve upper and lower clamping of the detected object.

In some preferred embodiments, the upper limiting device 10 is provided with upper threaded holes 11 and a magnetic particle calibration hole 12;

the upper threaded holes 11 form left-right symmetry about a center of the upper limiting device 10 to fix the auxiliary clamping device 30; and the magnetic particle calibration hole 12 is configured to mount the MPI calibration sample 40.

In some preferred embodiments, the lower limiting device 20 is provided with lateral threaded holes 23 at different lateral positions; and the lateral threaded holes 23 are configured to mount screws according to a size of the detected object, so as to achieve clamping of two sides of the detected object in the lower limiting device 20.

In some preferred embodiments, a lower end of the lower limiting device 20 is provided with an object table 24; and a surface of the object table 24 is provided with magnetic particle calibration holes at different positions, and the magnetic particle calibration holes are configured to mount the MPI calibration sample 40.

In some preferred embodiments, a back side of the elongated hole 22 is provided with a longitudinally fixed size scale 13.

In some preferred embodiments, the auxiliary clamping device 30 includes a long hand screw 31 and an auxiliary clamping side plate 32;

the auxiliary clamping device 30 is connected to the upper threaded hole of the upper limiting device 10 through the long hand screw 31;

the auxiliary clamping side plate 32 is fixed to a long shank of the long hand screw 31, and is rotatable to adjust a front-rear position and a clamping angle of the auxiliary clamping side plate 32; and a surface of the auxiliary clamping side plate 32 is provided with multiple magnetic particle calibration holes, and the magnetic particle calibration holes are configured to mount the MPI calibration sample 40.

In some preferred embodiments, the MPI calibration sample 40 includes a sample cavity 41 and an injection hole 42 for MPI calibration;

a magnetic particle solution is injected into the sample cavity 41 through the injection hole 42; and the MPI calibration sample 40 is fixed through the magnetic particle calibration holes at the upper limiting device 10, the lower limiting device 20, the auxiliary clamping device 30, and any other position in the system.

In some preferred embodiments, the upper limiting device 10, the lower limiting device 20, the auxiliary clamping device 30, the hand screw, and the MPI calibration sample 40 are all made of a non-metallic material through three-dimensional (3D) printing, mold forming, or mechanical processing.

In some preferred embodiments, all parts of the upper limiting device 10, the lower limiting device 20, and the auxiliary clamping device 30 that come into contact with the detected object are wrapped with a soft material or soft pad for buffering.

The present disclosure has following beneficial effects:
(1) In the fixation and registration calibration system for multimodal MPI in the present disclosure, when MPI is performed on a detected object, the detected object is clamped by the upper limiting device and the lower limiting device, and the distance between the upper limiting device and the lower limiting device is freely adjusted by adjusting a knob at the elongated hole according to the height of the detected object. There are multiple threaded holes with different heights mounted at different positions at two ends of the device. According to actual fixation needs, hand screws are mounted at different threaded holes to achieve the fixation of two ends of the object. The upper end of the device is provided with the auxiliary clamping device, and the rotation and auxiliary clamping of the auxiliary clamping plate are achieved by twisting the long hand screw.
(2) In the fixation and registration calibration system for multimodal MPI in the present disclosure, the upper limiting device, the lower limiting device, the auxiliary clamping device, and any other position of the device can be provided with magnetic particle calibration holes. Before MPI is performed, the MPI calibration sample is mounted at a specific location based on the imaging field of view. The sample can be imaged in the MPI device or at a same location in a CT or MRI device.
(3) In the fixation and registration calibration system for multimodal MPI in the present disclosure, through the joint action of multi-directional clamping and the auxiliary clamping device, the detected object remains relatively stable with the device during the imaging process and the transfer to other imaging device at the end of imaging, thereby ensuring the accuracy of WI. In addition, the magnetic particle calibration object is fixed at the set position to facilitate the fusion of MPI results (without structural information) with other imaging modalities, thereby achieving stable and reliable multimodal MPI.

BRIEF DESCRIPTION OF THE DRAWINGS

Other features, objectives and advantages of the present disclosure will become more apparent upon reading the detailed description of the non-restrictive embodiments with reference to the following drawings.

REFERENCE NUMERALS

10. upper limiting device; 11. upper threaded hole; 12. magnetic particle calibration hole; 13. size scale; 20. lower limiting device; 21. limiting slide rail; 22. elongated hole; 23. lateral threaded hole; 24. object table; 30. auxiliary clamping device; 31. long hand screw; 32. auxiliary clamping side plate; 40. MPI calibration sample; 41. sample cavity; and 42. injection hole.

DETAILED DESCRIPTION OF THE EMBODIMENTS

The present disclosure will be further described in detail below with reference to the drawings and embodiments. It should be understood that the specific embodiments described herein are merely intended to explain the present disclosure, rather than to limit the present disclosure. It should also be noted that, for convenience of description, only the parts related to the present disclosure are shown in the accompanying drawings.

It should be noted that the embodiments in the present disclosure and features in the embodiments may be combined with each other in a non-conflicting situation. The present disclosure will be described in detail below with reference to the drawings and embodiments.

The present disclosure provides a fixation and registration calibration system for multimodal MPI. The system includes upper limiting device 10, lower limiting device 20, auxiliary clamping device 30, and MPI calibration sample 40.

The upper limiting device 10 is connected to the lower limiting device 20 by a hand screw and an adjustable position component. The upper limiting device 10 and the lower limiting device 20 each are symmetrical about the adjustable position component.

The auxiliary clamping device 30 is fixed at an upper end of the upper limiting device 10.

The upper limiting device 10, the lower limiting device 20, and the auxiliary clamping device 30 are provided with magnetic particle calibration holes at different positions.

The MPI calibration sample 40 is provided through the magnetic particle calibration holes to achieve spatial position registration calibration.

Figure 1:
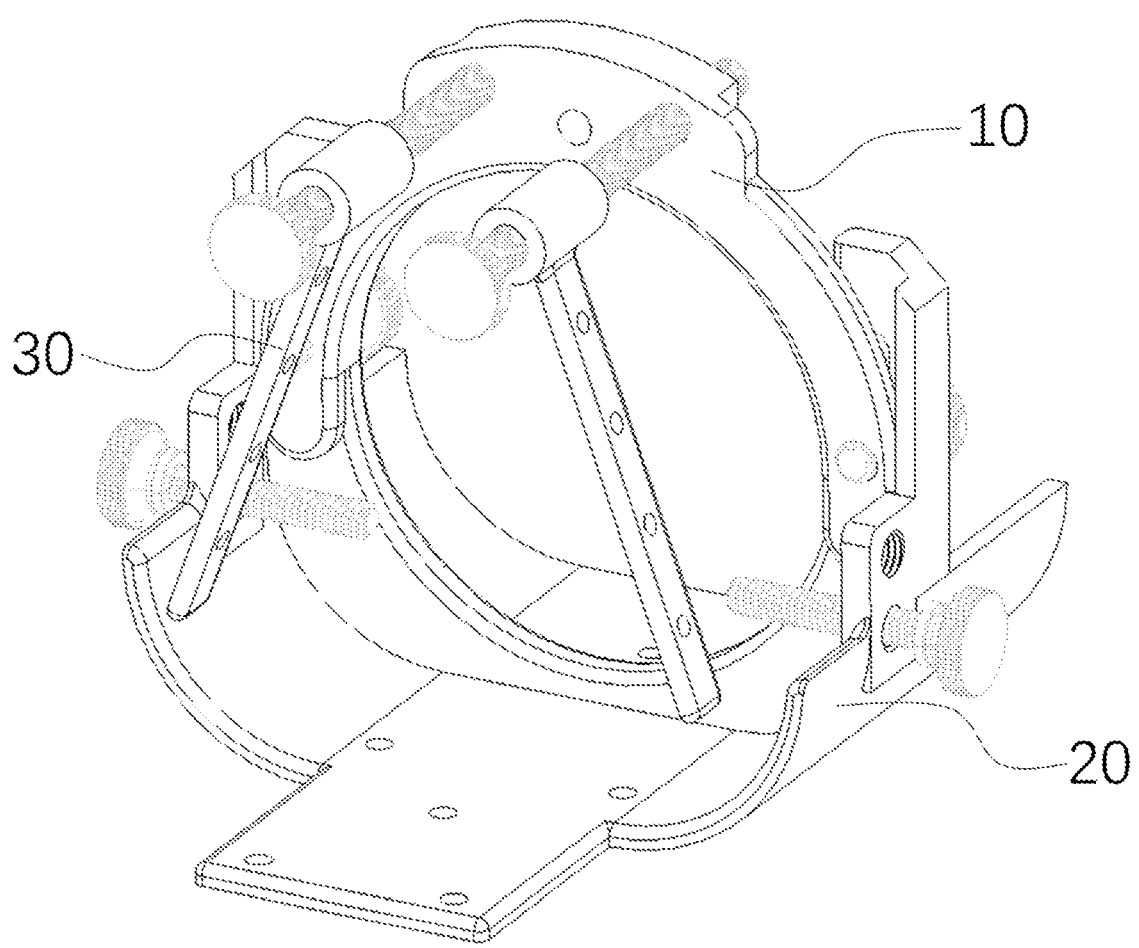
FIG. 1 is a structural diagram of a fixation and registration calibration system for multimodal magnetic particle imaging (MPI) according to the present disclosure.

To more clearly explain the fixation and registration calibration system for multimodal MPI in the present disclosure, modules in the embodiments of the present disclosure are described in detail below with reference to FIG. 1.

In a first embodiment of the present disclosure, the fixation and registration calibration system for multimodal MPI includes upper limiting device 10, lower limiting device 20, auxiliary clamping device 30, and MPI calibration sample 40. These modules are described in detail below.

The upper limiting device 10 is connected to the lower limiting device 20 by a hand screw and an adjustable position component. The upper limiting device 10 and the lower limiting device 20 each are symmetrical about the adjustable position component.

The adjustable position component includes limiting slide rail 21. The limiting slide rail 21 is configured to adjust and fix a displacement of each of the upper limiting device 10 and the lower limiting device 20 in upper and lower directions.

The limiting slide rail 21 is provided with elongated hole 22. The upper limiting device 10 and the lower limiting device 20 are fixed by a screw and the elongated hole 22.

The elongated hole 22 is configured to adjust a clamping height according to a size of a detected object, so as to achieve upper and lower clamping of the detected object.

The upper limiting device 10 is provided with upper threaded holes 11 and magnetic particle calibration hole 12. The upper threaded holes 11 form left-right symmetry about a center of the upper limiting device 10 to fix the auxiliary clamping device 30. The magnetic particle calibration hole 12 is configured to mount the MPI calibration sample 40.

The lower limiting device 20 is provided with lateral threaded holes 23 at different lateral positions. The lateral threaded holes 23 are configured to mount screws according to a size of the detected object, so as to achieve clamping of two sides of the detected object in the lower limiting device 20.

A lower end of the lower limiting device 20 is provided with object table 24. A surface of the surface of the object table 24 is provided with magnetic particle calibration holes at different positions to mount the MPI calibration sample 40.

A back side of the elongated hole 22 is provided with longitudinally fixed size scale 13.

The upper limiting device and the lower limiting device are connected by the hand screws, and the connection positions are located at left and right sides and symmetrically distributed. The auxiliary clamping device is fixed by the long hand screw at the upper end of the upper limiting device, that is, at the two threaded holes of the upper limiting device. The upper limiting device, the lower limiting device, and the auxiliary clamping device are provided with magnetic particle calibration holes at different positions. The MPI calibration sample is provided through the magnetic particle calibration holes to achieve spatial position calibration.

The fixation in the upper and lower directions is achieved through the upper limiting device and the lower limiting device, which is also the main structure of the present disclosure. The upper limiting device and the lower limiting device are connected through the limiting slide rail, such that the two parts can only produce displacement in the upper and lower directions to adjust and fix the limit space between the upper limiting device and the lower limiting device. The upper limiting device and the lower limiting device are mounted through the elongated holes through the screws. The clamping height of the elongated holes is adjustable according to the size of the detected object, so as to achieve upper and lower clamping.

The length of the limiting slide rail determines an adjustable distance range between the upper limiting device and the lower limiting device, which is also determined by the height of the detected object. The hand screw is configured to fix the distance between the upper limiting device and the lower limiting device. Specifically, the detected object is fixed between the upper limiting device and the lower limiting device, the height is adjusted to clamp the detected object, and the hand screws are tightened.

The limit space between the upper limiting device and the lower limiting device can be a circle, an ellipse, a square, a diamond, or in other regular or irregular shape.

Figure 2:
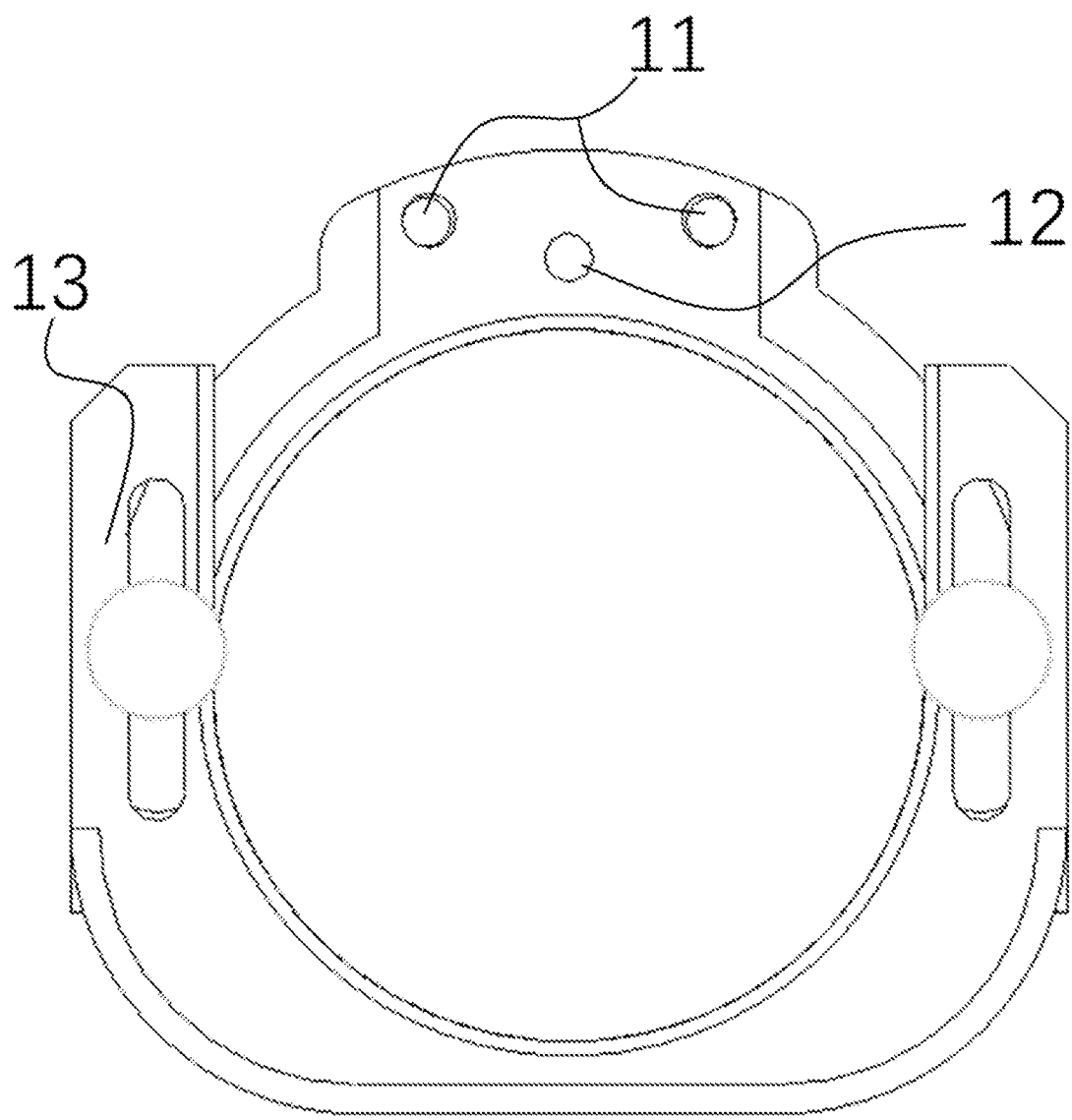
FIG. 2 is a schematic diagram of an upper limiting device of the fixation and registration calibration system for multimodal MPI according to the present disclosure.

FIG. 2 is a schematic diagram of the upper limiting device of the fixation and registration calibration system for multimodal MPI according to the present disclosure. The upper end of the upper limiting device is provided with the upper threaded holes that are located at left and right sides and are symmetrical to fix the auxiliary clamping device, and is further provided with the magnetic particle calibration hole to mount the MPI calibration sample. The number and position of the magnetic particle calibration hole of the upper limiting device for mounting the MPI calibration sample are set according to actual calibration needs.

Figure 3:
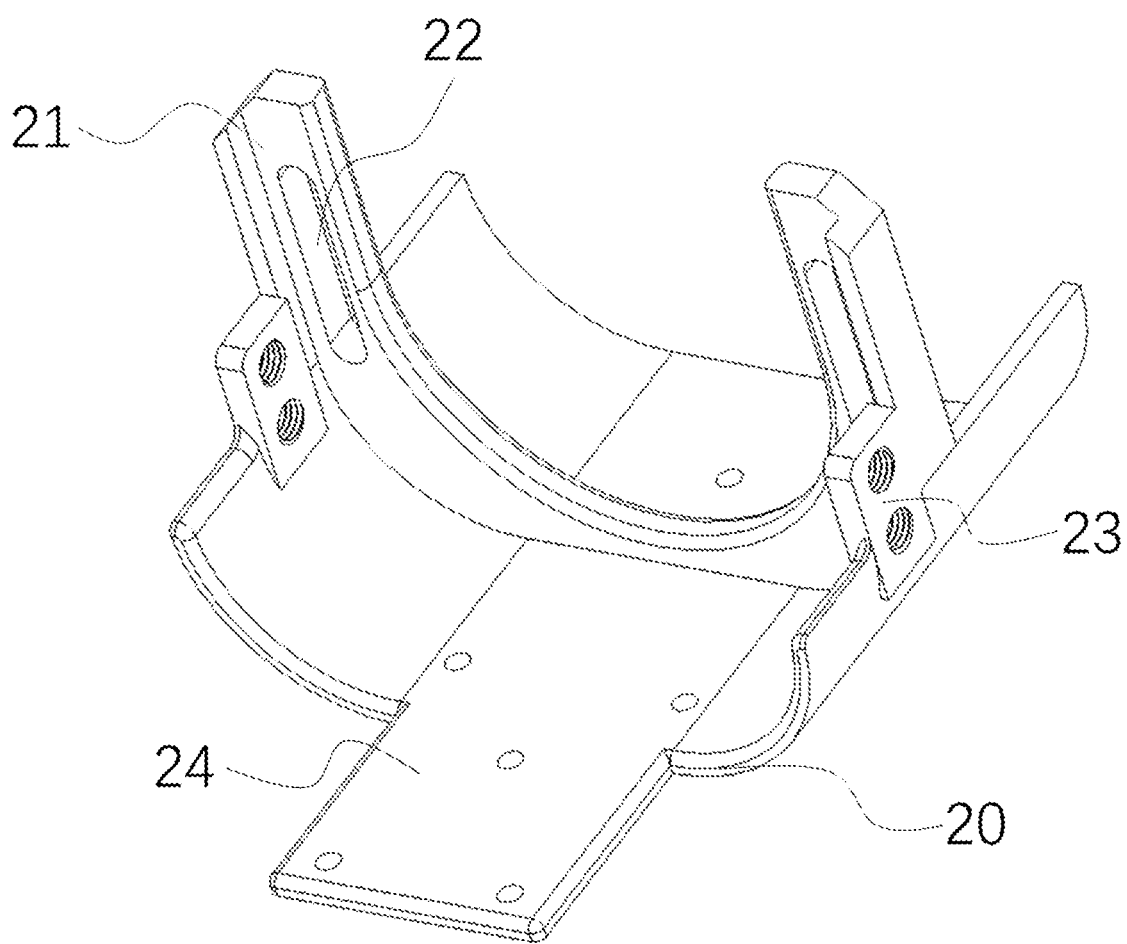
FIG. 3 is a schematic diagram of a lower limiting device of the fixation and registration calibration system for multimodal MPI according to the present disclosure.

FIG. 3 is a schematic diagram of the lower limiting device of the fixation and registration calibration system for multimodal MPI according to the present disclosure. The lower limiting device is provided with lateral threaded holes at different lateral positions, and screws are tightened in at the threaded holes according to the size of the detected object so as to achieve the clamping of the device on both sides. The lower limiting device can be provided with multiple lateral threaded holes to achieve autonomous adjustment of the object clamping position according to different fixation and positioning requirements. Specifically, after the detected object is fixed in both the upper and lower directions, hand screws are mounted in appropriate lateral threaded holes to contact with the detected object. The left and right sides of the detected object are fixed through the lateral threaded holes and the hand screws on both sides.

In FIG. 3, the lower end of the lower limiting device is provided with the object table. The surface of the object table is provided with magnetic particle calibration holes at different positions to mount the MPI calibration sample. The detected object is placed and fixed on the object table.

The object table can be flat or circular in shape, and it is required to fit with the detected object according to the shape of a lower edge of the detected object, so as to ensure fixation stability.

The lower limiting device is provided with the longitudinally fixed size scale on the back side of the elongated hole to determine and record the distance between the upper limiting device and the lower limiting device.

The auxiliary clamping device 30 is fixed at an upper end of the upper limiting device 10.

The auxiliary clamping device 30 includes long hand screw 31 and auxiliary clamping side plate 32.

The auxiliary clamping device 30 is connected to the upper threaded hole of the upper limiting device 10 through the long hand screw 31.

The auxiliary clamping side plate 32 is fixed to a long shank of the long hand screw 31, and is rotatable to adjust a front-rear position and a clamping angle of the auxiliary clamping side plate 32.

A surface of the auxiliary clamping side plate 32 is provided with multiple magnetic particle calibration holes to mount the MPI calibration sample 40.

Figure 4:
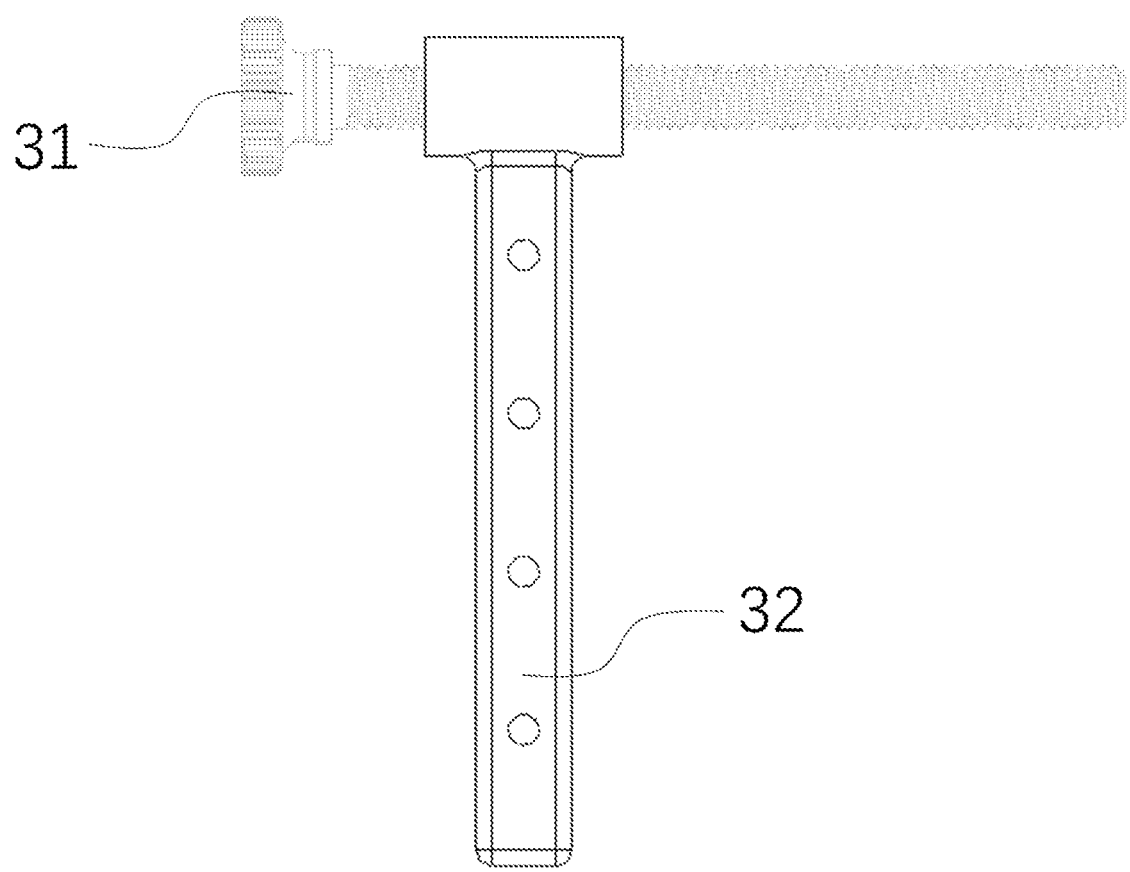
FIG. 4 is a schematic diagram of an auxiliary and clamping device of the fixation and registration calibration system for multimodal MPI according to the present disclosure.

FIG. 4 is a schematic diagram of the auxiliary and clamping device of the fixation and registration calibration system for multimodal MPI according to the present disclosure. The auxiliary clamping device includes two parts: the long hand screw and the auxiliary clamping side plate.

The auxiliary clamping device is connected to the upper threaded hole of the upper limiting device through the long hand screw. The auxiliary clamping side plate is fixed to the long hand screw, and the auxiliary clamping side plate is rotatable to adjust the front-rear position and clamping angle of the auxiliary clamping side plate. Specifically, after the detected object is fixed to the device, the hand screw is rotated to move the auxiliary clamping side plate inward or outward. After the auxiliary clamping side plate is moved to a suitable auxiliary clamping position, the hand screw and the upper limiting device remain relatively stationary. The auxiliary clamping side plate is rotated to contact with the detected object so as to achieve auxiliary clamping.

In order to well stabilize and fix the detected object, the auxiliary clamping side plate can be a straight plate or a curved plate. The auxiliary clamping side plate is required to be fit with a surface of the detected object so as to achieve a desired auxiliary clamping effect.

The auxiliary clamping side plate can achieve auxiliary clamping at both ends of the detected object through rotation and displacement. A surface of the auxiliary clamping side plate is provided with multiple magnetic particle calibration holes to mount the MPI calibration sample.

The upper limiting device 10, the lower limiting device 20, and the auxiliary clamping device 30 are provided with magnetic particle calibration holes at different positions.

Figure 5:
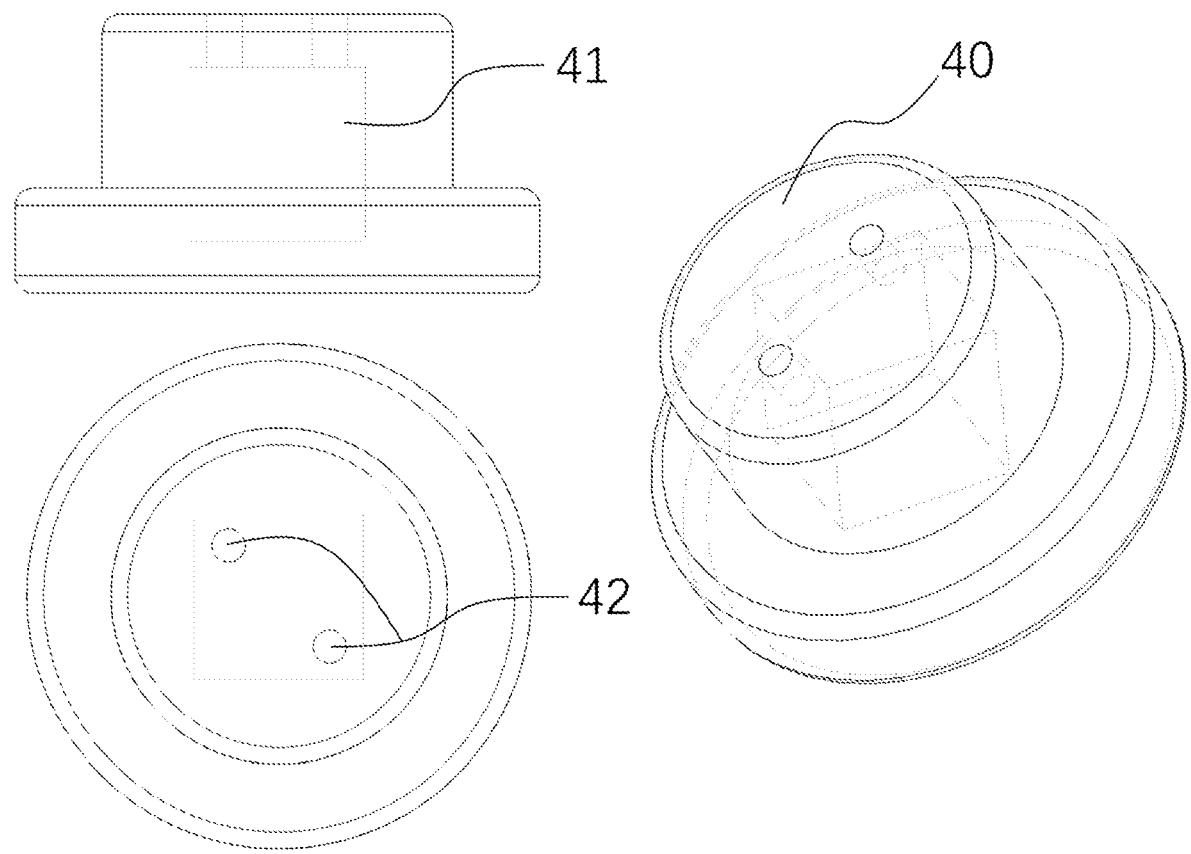
FIG. 5 is a schematic diagram of an MPI calibration sample of the fixation and registration calibration system for multimodal MPI according to the present disclosure.

FIG. 5 is a schematic diagram of the MPI calibration sample of the fixation and registration calibration system for multimodal MPI according to the present disclosure. The MPI calibration sample 40 is provided through the magnetic particle calibration holes to achieve spatial position registration calibration. The MPI calibration sample 40 includes sample cavity 41 and injection hole 42 for MPI calibration.

A magnetic particle solution is injected into the sample cavity 41 through the injection hole 42.

The MPI calibration sample 40 is fixed through the magnetic particle calibration holes at the upper limiting device 10, the lower limiting device 20, the auxiliary clamping device 30, and any other position in the system.

The magnetic particle solution can be imaged through MPI, CT, and MRI. In order to achieve the best imaging effect, the magnetic particle solution is generally a high-concentration stock solution.

The magnetic particle cavity of the MPI calibration sample can be a cube, a sphere, a cylinder, or in other regular or irregular shape. The volume of the magnetic particle cavity is generally small, and it is determined based on the imaging performance of the MPI system.

The MPI calibration sample is fixed through the magnetic particle calibration holes at the upper limiting device, the lower limiting device, the auxiliary clamping device, and any other position in the system The upper limiting device, the lower limiting device, the auxiliary clamping device, the hand screw, and the MPI calibration sample are all made of a non-metallic material through 3D printing, mold forming, or mechanical processing.

All parts of the upper limiting device, the lower limiting device, and the auxiliary clamping device that come into contact with the detected object are wrapped with a soft material or soft pad for buffering.

In the fixation and registration calibration system for multimodal MPI in the present disclosure, when MPI is performed on a detected object, the detected object is clamped by the upper limiting device and the lower limiting device, and the distance between the upper limiting device and the lower limiting device is freely adjusted by adjusting a knob at the elongated hole according to the height of the detected object. There are multiple threaded holes with different heights mounted at different positions at two ends of the device. According to actual fixation needs, hand screws are mounted at different threaded holes to achieve the fixation of two ends of the object. The upper end of the device is provided with the auxiliary clamping device, and the rotation and auxiliary clamping of the auxiliary clamping plate are achieved by twisting the long hand screw.

Further, the upper limiting device, the lower limiting device, the auxiliary clamping device, and any other position of the device can be provided with magnetic particle calibration holes. Before MPI is performed, the MPI calibration sample is mounted at a specific location based on the imaging field of view. The sample can be imaged in the MPI device or at a same location in a CT or MRI device.

In the fixation and registration calibration system for multimodal MPI in the present disclosure, through the joint action of multi-directional clamping and the auxiliary clamping device, the detected object remains relatively stable with the device during the imaging process and the transfer to other imaging device at the end of imaging, thereby ensuring the accuracy of MPI. In addition, the magnetic particle calibration object is fixed at the set position of the system to facilitate the fusion of MPI results (without structural information) with other imaging modalities, thereby achieving stable and reliable multimodal MPI.

It should be noted that the fixation and registration calibration system for multimodal magnetic particle imaging in the above embodiments is only described by taking the division of the above functional modules as an example. In practical applications, the above functions can be completed by different functional modules as required, that is, the modules in the embodiments of the present disclosure are further decomposed or combined. For example, the modules in the above embodiments may be combined into one module, or may be further divided into a plurality of sub-modules to complete all or part of the functions described above. The names of the modules involved in the embodiments of the present disclosure are only for distinguishing each module, and should not be regarded as improper limitations on the present disclosure.

Terms such as "first" and "second" are intended to distinguish between similar objects, rather than describe or indicate a specific order or sequence.

Terms "include", "comprise" or any other variations thereof are intended to cover non-exclusive inclusions, so that a process, a method, an article, or a device/apparatus including a series of elements not only includes those elements, but also includes other elements that are not explicitly listed, or also includes inherent elements of the process, the method, the article or the device/apparatus.

The technical solutions of the present disclosure are described in the preferred implementations with reference to the drawings. Those skilled in the art should easily understand that the protection scope of the present disclosure is apparently not limited to these specific implementations. Those skilled in the art can make equivalent changes or substitutions to the relevant technical features without departing from the principles of the present disclosure, and the technical solutions derived by making these changes or substitutions should fall within the protection scope of the present disclosure.

What is claimed is:

1. A fixation and registration calibration system for multimodal magnetic particle imaging (MPI), comprising an upper limiting device, a lower limiting device, an auxiliary clamping device, and an MPI calibration sample, wherein the upper limiting device, the lower limiting device, and the auxiliary clamping device are provided with magnetic particle calibration holes at different positions; the MPI calibration sample is provided through the magnetic particle calibration holes to achieve spatial position registration calibration; wherein
   the upper limiting device is connected to the lower limiting device by a hand screw and an adjustable position component; and the upper limiting device and the lower limiting device each are symmetrical about the adjustable position component;
   the upper limiting device is provided with upper threaded holes and a magnetic particle calibration hole; the upper threaded holes form left-right symmetry about a center of the upper limiting device to fix the auxiliary clamping device; and the magnetic particle calibration hole is configured to mount the MPI calibration sample;
   a lower end of the lower limiting device is provided with an object table; and a surface of the object table is provided with magnetic particle calibration holes at different positions, and the magnetic particle calibration holes are configured to mount the MPI calibration sample; and
   the auxiliary clamping device is fixed at an upper end of the upper limiting device; the auxiliary clamping device comprises a long hand screw and an auxiliary clamping side plate; the auxiliary clamping device is connected to the upper threaded hole of the upper limiting device through the long hand screw; the auxiliary clamping side plate is fixed to a long shank of the long hand screw, and is rotatable to adjust a front-rear position and a clamping angle of the auxiliary clamping side plate; and a surface of the auxiliary clamping side plate is provided with multiple magnetic particle calibration holes, and the magnetic particle calibration holes are configured to mount the MPI calibration sample.

2. The fixation and registration calibration system for multimodal MPI according to claim 1, wherein the adjustable position component comprises a limiting slide rail;
   the limiting slide rail is configured to adjust and fix a displacement of each of the upper limiting device and the lower limiting device in upper and lower directions;
   the limiting slide rail is provided with an elongated hole; and the upper limiting device and the lower limiting device are fixed by a screw and the elongated hole; and
   the elongated hole is configured to adjust a clamping height according to a size of a detected object to achieve upper and lower clamping of the detected object.

3. The fixation and registration calibration system for multimodal MPI according to claim 1, wherein the lower limiting device is provided with lateral threaded holes at different lateral positions; and
   the lateral threaded holes are configured to mount screws according to a size of a detected object to clamp two sides of the detected object in the lower limiting device.

4. The fixation and registration calibration system for multimodal MPI according to claim 2, wherein a back side of the elongated hole is provided with a longitudinally fixed size scale.

5. The fixation and registration calibration system for multimodal MPI according to claim 1, wherein the MPI calibration sample comprises a sample cavity and an injection hole for MPI calibration;
   a magnetic particle solution is injected into the sample cavity through the injection hole; and
   the MPI calibration sample is fixed through the magnetic particle calibration holes at the upper limiting device, the lower limiting device, the auxiliary clamping device, and any other position in the system.

6. The fixation and registration calibration system for multimodal MPI according to claim 1, wherein the upper limiting device, the lower limiting device, the auxiliary clamping device, the hand screw, and the MPI calibration sample are all made of a non-metallic material through three-dimensional printing, mold forming, or mechanical processing.

7. The fixation and registration calibration system for multimodal MPI according to claim 1, wherein all parts of the upper limiting device, the lower limiting device, and the auxiliary clamping device that come into contact with the detected object are wrapped with a soft material or soft pad for buffering.

8. The fixation and registration calibration system for multimodal MPI according to claim 2, wherein the upper limiting device, the lower limiting device, the auxiliary clamping device, the hand screw, and the MPI calibration sample are all made of a non-metallic material through three-dimensional printing, mold forming, or mechanical processing.

9. The fixation and registration calibration system for multimodal MPI according to claim 3, wherein the upper limiting device, the lower limiting device, the auxiliary clamping device, the hand screw, and the MPI calibration sample are all made of a non-metallic material through three-dimensional printing, mold forming, or mechanical processing.

10. The fixation and registration calibration system for multimodal MPI according to claim 4, wherein the upper limiting device, the lower limiting device, the auxiliary clamping device, the hand screw, and the MPI calibration sample are all made of a non-metallic material through three-dimensional printing, mold forming, or mechanical processing.

11. The fixation and registration calibration system for multimodal MPI according to claim 5, wherein the upper limiting device, the lower limiting device, the auxiliary clamping device, the hand screw, and the MPI calibration sample are all made of a non-metallic material through three-dimensional printing, mold forming, or mechanical processing.

12. The fixation and registration calibration system for multimodal MPI according to claim 2, wherein all parts of the upper limiting device, the lower limiting device, and the auxiliary clamping device that come into contact with the detected object are wrapped with a soft material or soft pad for buffering.

13. The fixation and registration calibration system for multimodal MPI according to claim 3, wherein all parts of the upper limiting device, the lower limiting device, and the auxiliary clamping device that come into contact with the detected object are wrapped with a soft material or soft pad for buffering.

14. The fixation and registration calibration system for multimodal MPI according to claim 4, wherein all parts of the upper limiting device, the lower limiting device, and the auxiliary clamping device that come into contact with the detected object are wrapped with a soft material or soft pad for buffering.

15. The fixation and registration calibration system for multimodal MPI according to claim 5, wherein all parts of the upper limiting device, the lower limiting device, and the auxiliary clamping device that come into contact with the detected object are wrapped with a soft material or soft pad for buffering.

\* \* \* \* \*